(12) United States Patent
Inoue et al.

(10) Patent No.: US 12,413,198 B2
(45) Date of Patent: Sep. 9, 2025

(54) ACOUSTIC WAVE DEVICE

(71) Applicant: Murata Manufacturing Co., Ltd., Nagaokakyo (JP)

(72) Inventors: Kazunori Inoue, Nagaokakyo (JP); Katsumi Suzuki, Nagaokakyo (JP); Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 182 days.

(21) Appl. No.: 18/370,653

(22) Filed: Sep. 20, 2023

(65) Prior Publication Data

US 2024/0014795 A1  Jan. 11, 2024

Related U.S. Application Data

(63) Continuation of application No. PCT/JP2022/016229, filed on Mar. 30, 2022.

(60) Provisional application No. 63/168,338, filed on Mar. 31, 2021.

(51) Int. Cl.
  *H03H 9/02* (2006.01)
  *H03H 9/205* (2006.01)

(52) U.S. Cl.
  CPC .... *H03H 9/02015* (2013.01); *H03H 9/02086* (2013.01); *H03H 9/205* (2013.01)

(58) Field of Classification Search
  CPC ........... H03H 9/02015; H03H 9/02086; H03H 9/205; H03H 9/02157; H03H 9/174; H03H 9/564; H03H 9/568; H03H 9/02228
  USPC .......................... 333/186, 187, 188, 193–196
  See application file for complete search history.

(56) References Cited

U.S. PATENT DOCUMENTS

| | | | |
|---|---|---|---|
| 10,469,053 B2 * | 11/2019 | Omura | H03H 3/08 |
| 2011/0284995 A1 | 11/2011 | Kuypers et al. | |
| 2014/0009032 A1 * | 1/2014 | Takahashi | H03H 9/02559 29/25.35 |

(Continued)

FOREIGN PATENT DOCUMENTS

| | | |
|---|---|---|
| JP | 2012257019 A | 12/2012 |
| JP | 2019009671 A | 1/2019 |
| JP | 2019201305 A | 11/2019 |

OTHER PUBLICATIONS

International Search Report in PCT/JP2022/016229, mailed Jun. 28, 2022, 3 pages.

(Continued)

*Primary Examiner* — Jorge L Salazar, Jr.
(74) *Attorney, Agent, or Firm* — Keating & Bennett, LLP

(57) ABSTRACT

An acoustic wave device includes a support including a support substrate with a thickness in a first direction, a piezoelectric layer on the support in the first direction, and resonators each including a functional electrode on the piezoelectric layer in the first direction. The support includes first and second space portions at positions where the respective resonators at least partially overlap in plan view in the first direction, the second space portion with an area larger than an area of the first space portion in plan view in the first direction. The piezoelectric layer includes first and second through-holes respectively communicating with the first and second space portions, and the first through-hole has an area larger than an area of the second through-hole in plan view in the first direction.

20 Claims, 18 Drawing Sheets

(56) References Cited

U.S. PATENT DOCUMENTS

2014/0152145 A1* 6/2014 Kando ............... H03H 9/02574
29/25.35
2021/0091747 A1 3/2021 Turner et al.

OTHER PUBLICATIONS

Written Opinion in PCT/JP2022/016229, mailed Jun. 28, 2022, 3 pages.

* cited by examiner

ACOUSTIC WAVE DEVICE

CROSS REFERENCE TO RELATED APPLICATIONS

This application claims the benefit of priority to Provisional Application No. 63/168,338 filed on Mar. 31, 2021 and is a Continuation Application of PCT Application No. PCT/JP2022/016229 filed on Mar. 30, 2022. The entire contents of each application are hereby incorporated herein by reference.

BACKGROUND OF THE INVENTION

1. Field of the Invention

The present disclosure relates to an acoustic wave device.

2. Description of the Related Art

Japanese Unexamined Patent Application Publication No. 2012-257019 describes an acoustic wave device.

In the acoustic wave device described in Japanese Unexamined Patent Application Publication No. 2012-257019, a through-hole communicating with a space portion may be provided in a piezoelectric layer as an etching hole to provide space portions having different areas. In the case above, there is a possibility that an etching liquid does not dry at a speed suitable for the size of the space portion, and sticking occurs in a large space portion and the etching liquid dries slowly in a small space portion.

SUMMARY OF THE INVENTION

Preferred embodiments of the present invention simultaneously achieve reduction or prevention of sticking in a space portion and reduction of drying time.

An acoustic wave device according to a preferred embodiment of the present invention includes a support including a support substrate with a thickness in a first direction, a piezoelectric layer on the support in the first direction, and resonators each including a functional electrode on the piezoelectric layer in the first direction. The support includes space portions at positions where the respective resonators at least partially overlap in plan view in the first direction, the space portions include a first space portion and a second space portion with an area larger than an area of the first space portion in plan view in the first direction, the piezoelectric layer includes a first through-hole communicating with the first space portion and a second through-hole communicating with the second space portion, and the first through-hole has an area larger than an area of the second through-hole in plan view in the first direction.

According to preferred embodiments of the present invention, reduction or prevention of sticking in a space portion and reduction of a drying time id simultaneously achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the drawings. The present disclosure is not limited to the preferred embodiments. Each preferred embodiment described in the present disclosure is exemplary, and in different preferred embodiments, such as modifications thereof in which partial replacement or combination of configurations is possible and the subsequent preferred embodiments and modifications, a description of matters common to the first preferred embodiment will be omitted and only differences will be described. In particular, the same or similar advantageous operational effects obtained by the same or similar configurations will not be described in each preferred embodiment.

First Preferred Embodiment

Figure 1A:
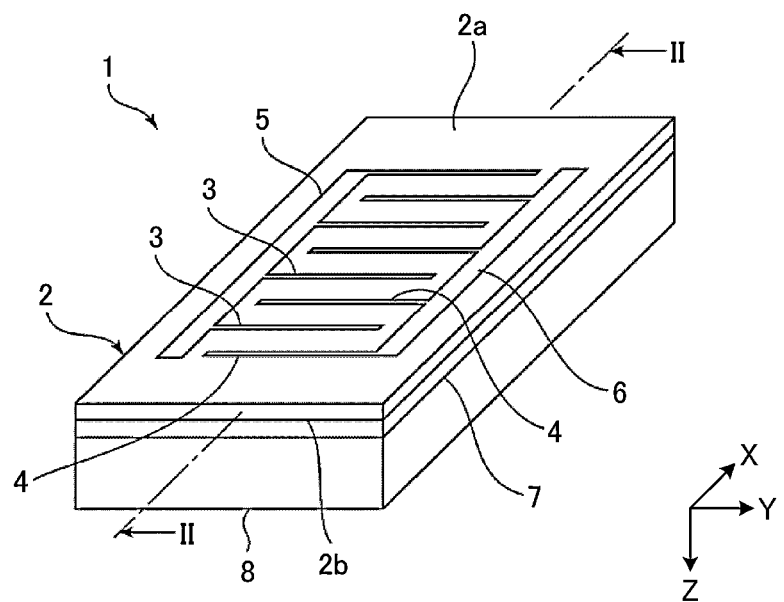
FIG. 1A is a perspective view of an acoustic wave device of a first preferred embodiment of the present invention.
Figure 1B:
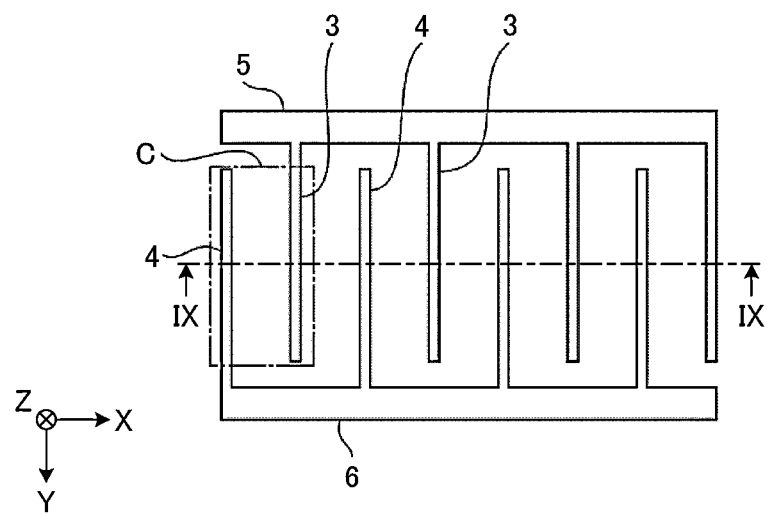
FIG. 1B is a plan view of an electrode structure of the first preferred embodiment of the present invention.

FIG. 1A is a perspective view of an acoustic wave device of a first preferred embodiment of the present invention. FIG. 1B is a plan view of an electrode structure of the first preferred embodiment.

An acoustic wave device 1 of the first preferred embodiment includes a piezoelectric layer 2 made of, for example, LiNbO$_3$. The piezoelectric layer 2 may be made of, for example, LiTaO$_3$. A cut angle of each of LiNbO$_3$ and LiTaO$_3$ is a Z-cut in the first preferred embodiment. The cut angle of LiNbO$_3$ or LiTaO$_3$ may be a rotated Y-cut or an X-cut. Preferably, the propagation orientation of Y-propagation and X-propagation of about ±30° is preferred.

A thickness of the piezoelectric layer 2 is not particularly limited, but is preferably, for example, about 50 nm or more and about 1000 nm or less in order to effectively excite a thickness-shear primary mode.

The piezoelectric layer 2 includes a first main surface 2a and a second main surface 2b opposed to each other in a Z-direction. An electrode finger 3 and an electrode finger 4 are provided on the first main surface 2a.

Here, the electrode finger 3 is an example of a "first electrode finger", and the electrode finger 4 is an example of a "second electrode finger". In FIGS. 1A and 1B, electrode fingers 3 are the "first electrode fingers" connected to a first busbar electrode 5. Electrode fingers 4 are the "second electrode fingers" connected to a second busbar electrode 6. The electrode fingers 3 and the electrode fingers 4 are interdigitated with each other. As a result, an interdigital transducer (IDT) electrode including the electrode finger 3, the electrode finger 4, the first busbar electrode 5, and the second busbar electrode 6 is provided.

Each of the electrode finger 3 and the electrode finger 4 has a rectangular or substantially rectangular shape and a length direction. In a direction orthogonal or substantially orthogonal to the length direction, the electrode finger 3 and the electrode finger 4 adjacent to the electrode finger 3 face each other. Both of the length direction of the electrode fingers 3 and 4, and a direction orthogonal or substantially orthogonal to the length direction of the electrode fingers 3 and 4 are directions intersecting a thickness direction of the piezoelectric layer 2. Therefore, it can be said that the electrode finger 3 and the electrode finger 4 adjacent to the electrode finger 3 face each other in the direction intersecting the thickness direction of the piezoelectric layer 2. In the following description, the thickness direction of the piezoelectric layer 2 may be referred to as the Z-direction (or a first direction), the length direction of the electrode fingers 3 and 4 may be referred to as a Y-direction (or a second direction), and a direction orthogonal to the length direction of the electrode fingers 3 and 4 may be referred to as an X-direction (or a third direction).

Further, the length direction of the electrode fingers 3 and 4 may be replaced with the direction orthogonal or substantially orthogonal to the length direction of the electrode fingers 3 and 4 illustrated in FIGS. 1A and 1B. That is, the electrode fingers 3 and 4 may extend in a direction in which the first busbar electrode 5 and the second busbar electrode 6 extend in FIGS. 1A and 1B. In the case above, the first busbar electrode 5 and the second busbar electrode 6 extend in a direction in which the electrode fingers 3 and 4 extend in FIGS. 1A and 1B. A structure of a pair in which the electrode finger 3 connected to one electric potential and the electrode finger 4 connected to the other electric potential are adjacent to each other is configured, and multiple pairs are provided in the direction orthogonal or substantially orthogonal to the length direction of the electrode fingers 3 and 4.

Here, the electrode finger 3 and the electrode finger 4 being adjacent to each other does not refer to a case that the electrode finger 3 and the electrode finger 4 are disposed to be in direct contact with each other, but refers to a case that the electrode finger 3 and the electrode finger 4 are disposed with a gap therebetween. Further, when the electrode finger 3 and the electrode finger 4 are adjacent to each other, an electrode connected to a hot electrode or a ground electrode including other electrode fingers 3 and 4 is not disposed between the electrode finger 3 and the electrode finger 4. The number of pairs need not be integer pairs, but may be 1.5 pairs, 2.5 pairs, or the like.

A center-to-center distance between the electrode fingers 3 and 4, that is, a pitch is preferably, for example, in a range of about 1 μm or more and about 10 μm or less. Further, the center-to-center distance between the electrode fingers 3 and 4 is a distance connecting a center of a width dimension of the electrode finger 3 in a direction orthogonal or substantially orthogonal to the length direction of the electrode finger 3 and a center of a width dimension of the electrode finger 4 in a direction orthogonal or substantially orthogonal to the length direction of the electrode finger 4.

Furthermore, when at least one of the electrode finger 3 and the electrode finger 4 includes multiple electrode fingers (in a case that 1.5 or more of electrode pairs are present when the electrode fingers 3 and 4 are defined as an electrode pair), the center-to-center distance between the electrode fingers 3 and 4 refers to an average value of the respective center-to-center distances between the electrode fingers 3 and 4 adjacent to each other out of 1.5 or more pairs of the electrode fingers 3 and 4.

A width of each of the electrode fingers 3 and 4, that is, a dimension of each of the electrode fingers 3 and 4 in a facing direction is preferably, for example, in a range of about 150 nm or more and about 1000 nm or less. The center-to-center distance between the electrode fingers 3 and 4 is a distance connecting a center of a dimension (width dimension) of the electrode finger 3 in the direction orthogonal or substantially orthogonal to the length direction of the electrode finger 3 and a center of a dimension (width dimension) of the electrode finger 4 in the direction orthogonal to the length direction of the electrode finger 4.

In the first preferred embodiment, since the Z-cut piezoelectric layer is used, the direction orthogonal or substantially orthogonal to the length direction of the electrode fingers 3 and 4 is a direction orthogonal or substantially orthogonal to a polarization direction of the piezoelectric layer 2. This is not the case when a piezoelectric body with another cut angle is used for the piezoelectric layer 2. Here, "orthogonal" is not limited to strictly orthogonal but may be substantially orthogonal (an angle formed by the direction orthogonal to the length direction of the electrode fingers 3 and 4, and the polarization direction may be about 90°±10°, for example).

Figure 2:
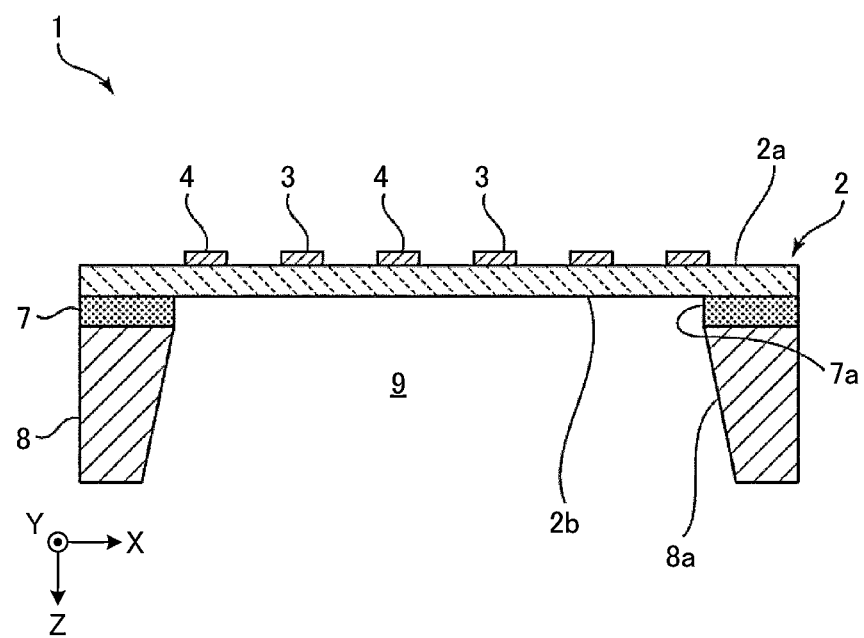
FIG. 2 is a sectional view of a portion taken along line II-II in FIG. 1A.

A support substrate 8 is laminated on the piezoelectric layer 2 on a second main surface 2b side with a dielectric layer 7 interposed therebetween. The dielectric layer 7 and the support substrate 8 each have a frame shape, and include openings 7a and 8a, respectively, as illustrated in FIG. 2. Thus, a space portion (air gap) 9 is provided.

The space portion 9 is provided so as not to disturb vibration of an excitation region C of the piezoelectric layer 2. Therefore, the support substrate 8 is laminated on the second main surface 2b with the dielectric layer 7 interposed therebetween at a position not overlapping a portion where at least one pair of the electrode fingers 3 and 4 is provided. The dielectric layer 7 is not necessarily provided. Therefore, the support substrate 8 may directly or indirectly be laminated on the second main surface 2b of the piezoelectric layer 2.

The dielectric layer 7 is made of, for example, silicon oxide. The dielectric layer 7 may be made of an appropriate insulation material such as, for example, silicon nitride or alumina in addition to silicon oxide.

The support substrate 8 is made of, for example, Si. A plane orientation of a surface of Si on the piezoelectric layer 2 side may be (100), (110), or (111). Preferably, high-resistance Si having resistivity of, for example, about 4 kΩ or more is preferable. However, the support substrate 8 as well may be made using an appropriate insulation material or semiconductor material. Examples of the material of the support substrate 8 include piezoelectric materials such as aluminum oxide, lithium tantalate, lithium niobate, and quartz; various ceramics such as alumina, magnesia, sapphire, silicon nitride, aluminum nitride, silicon carbide, zirconia, cordierite, mullite, steatite, and forsterite; dielectrics such as diamond and glass; and semiconductors such as gallium nitride.

The electrode fingers 3 and 4, the first busbar electrode 5, and the second busbar electrode 6 are made of an appropriate metal or an alloy such as, for example, Al and an AlCu alloy. In the first preferred embodiment, the electrode fingers 3 and 4, the first busbar electrode 5, and the second busbar electrode 6 each have a structure in which, for example, an Al film is laminated on a Ti film. An adhesion layer other than the Ti film may be used.

At the time of driving, an AC voltage is applied between the electrode fingers 3 and the electrode fingers 4. More specifically, an AC voltage is applied between the first busbar electrode 5 and the second busbar electrode 6. It is said that resonance characteristics using a bulk wave of a thickness-shear primary mode excited in the piezoelectric layer 2 may be obtained by the operation described above.

Further, in the acoustic wave device 1, d/p is, for example, about 0.5 or less when d represents the thickness of the piezoelectric layer 2 and p represents a center-to-center distance between any electrode fingers 3 and 4 adjacent to each other out of multiple pairs of the electrode fingers 3 and 4. Therefore, a bulk wave of a thickness-shear primary mode is effectively excited, and good resonance characteristics may be obtained. More preferably, d/p is, for example, about 0.24 or less, and further good resonance characteristics may be obtained in that case.

In a case that at least one of the electrode fingers 3 and 4 includes multiple electrode fingers as in the first preferred embodiment, that is, in a case that 1.5 or more pairs of electrode fingers 3 and 4 are present when the electrode fingers 3 and 4 are defined as an electrode pair, the center-to-center distance p between the electrode fingers 3 and 4 adjacent to each other is an average distance of the respective center-to-center distances between the electrode fingers 3 and 4 adjacent to each other.

Since the acoustic wave device 1 according to the first preferred embodiment has the above-described configuration, even when the number of pairs of the electrode fingers 3 and 4 is decreased in order to reduce in size, a Q factor is less likely to be reduced. This is because a resonator does not require reflectors on both sides and has small propagation loss. Further, the reason why the reflectors are not required is that a bulk wave of a thickness-shear primary mode is used.

Figure 3A:
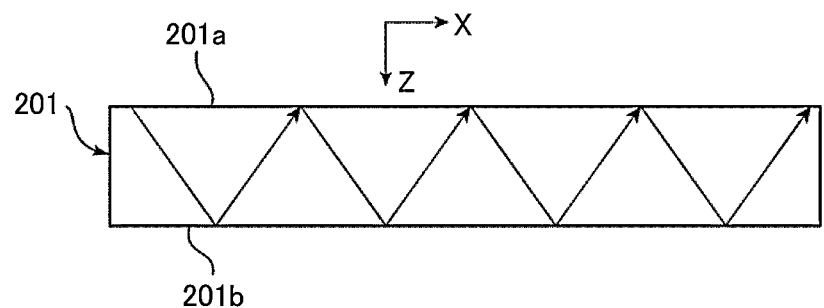
FIG. 3A is a schematic sectional view for describing a Lamb wave propagating through a piezoelectric layer of a comparative example.
Figure 3B:
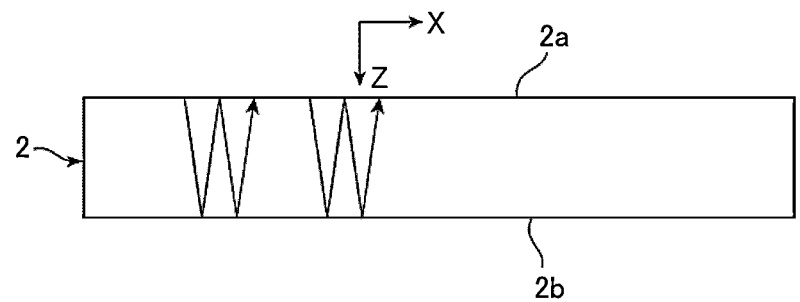
FIG. 3B is a schematic sectional view for describing a bulk wave of a thickness-shear primary mode propagating through a piezoelectric layer of the first preferred embodiment of the present invention.
Figure 4:
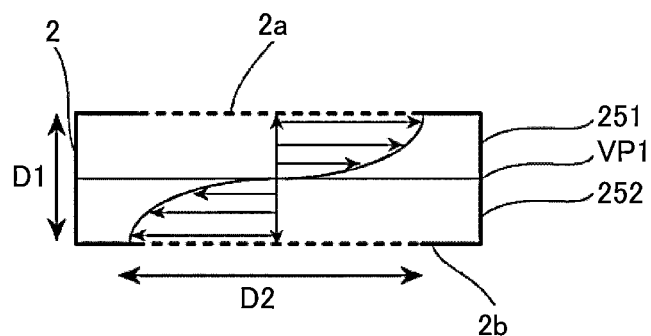
FIG. 4 is a schematic sectional view for describing an amplitude direction of a bulk wave of a thickness-shear primary mode propagating through the piezoelectric layer of the first preferred embodiment of the present invention.

FIG. 3A is a schematic sectional view for describing a Lamb wave propagating through a piezoelectric layer of a comparative example. FIG. 3B is a schematic sectional view for describing a bulk wave of a thickness-shear primary mode propagating through a piezoelectric layer of the first preferred embodiment. FIG. 4 is a schematic sectional view for describing an amplitude direction of a bulk wave of a thickness-shear primary mode propagating through the piezoelectric layer of the first preferred embodiment.

As illustrated in FIG. 3A, a Lamb wave propagates through a piezoelectric layer in an acoustic wave device as described in Japanese Unexamined Patent Application Publication No. 2012-257019. A wave propagates through a piezoelectric layer 201 as described by an arrow as illustrated in FIG. 3A. Here, the piezoelectric layer 201 has a first main surface 201a and a second main surface 201b, and a thickness direction connecting the first main surface 201a and the second main surface 201b is the Z-direction. The X-direction is a direction in which the electrode fingers 3 and 4 of the IDT electrode are arranged. In the Lamb wave, a wave propagates in the X-direction as illustrated in FIG. 3A. Because of a plate wave, the wave propagates in the X-direction although the entire piezoelectric layer 201 vibrates, and reflectors are disposed on both sides to obtain resonance characteristics. Propagation loss of the wave occurs as a result, and when the size is reduced, that is, when the number of pairs of the electrode fingers 3 and 4 is decreased, the Q factor lowers.

Meanwhile, since a vibration displacement is in a thickness-shear direction in the acoustic wave device of the first preferred embodiment as illustrated in FIG. 3B, the wave substantially propagates in a direction connecting the first main surface 2a and the second main surface 2b of the piezoelectric layer 2, that is, the Z-direction, and resonates. That is, an X-direction component of a wave is significantly smaller than a Z-direction component. Since resonance characteristics are obtained by the propagation of a wave in the Z-direction, reflectors are not required. As a result, propagation loss does not occur when a wave propagates to the reflectors. Therefore, even when the number of electrode pairs constituted of the electrode fingers 3 and 4 is decreased in order to reduce in size, the Q factor is less likely to be reduced.

The amplitude direction of a bulk wave of a thickness-shear primary mode in a first region 251 included in the excitation region C (see FIG. 1B) is opposite to the amplitude direction thereof in a second region 252 included in the excitation region C of the piezoelectric layer 2 as illustrated in FIG. 4. FIG. 4 schematically illustrates a bulk wave when a voltage is applied between the electrode fingers 3 and 4 such that the electrode finger 4 has a higher electric potential than the electrode finger 3. The first region 251 is a region of the excitation region C between the first main surface 2a and a virtual plane VP1 that is orthogonal or substantially orthogonal to the thickness direction of the piezoelectric layer 2 and divides the piezoelectric layer 2 into two. The second region 252 is a region of the excitation region C between the virtual plane VP1 and the second main surface 2b.

In the acoustic wave device 1, at least one pair of electrodes including the electrode fingers 3 and 4 is provided. However, a wave is not intended to propagate in the X-direction. Thus, the number of electrode pairs of the electrode fingers 3 and 4 does not necessarily need to include multiple pairs. That is, at least one pair of electrodes needs to be provided.

For example, the electrode finger 3 is an electrode connected to a hot electric potential, and the electrode finger 4 is an electrode connected to a ground electric potential. However, the electrode finger 3 may be connected to the ground electric potential and the electrode finger 4 may be connected to the hot electric potential. In the first preferred embodiment, at least one pair of electrodes is an electrode connected to the hot electric potential or an electrode connected to the ground electric potential as described above, and a floating electrode is not provided.

Figure 5:
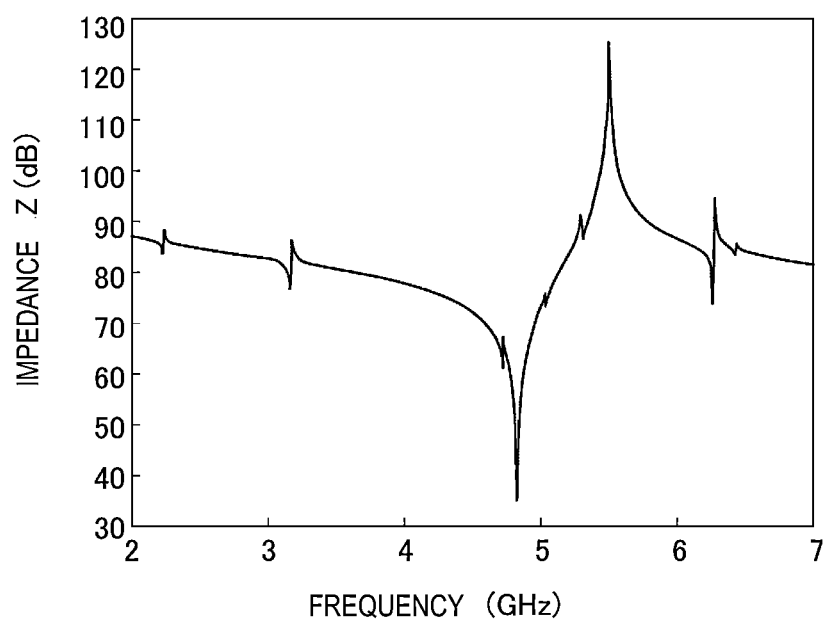
FIG. 5 is a graph illustrating an example of a resonance characteristic of the acoustic wave device of the first preferred embodiment of the present invention.

FIG. 5 is a graph illustrating an example of a resonance characteristic of the acoustic wave device of the first preferred embodiment. Design parameters of the acoustic wave device 1 having the resonance characteristics in FIG. 5 are as follows.

Piezoelectric layer 2: $LiNbO_3$ with Euler angles (0°, 0°, 90°)
Thickness of piezoelectric layer 2: about 400 nm
Length of excitation region C (see FIG. 1B): about 40 μm
Number of pairs of electrodes constituted of electrode fingers 3 and 4: 21 pairs
Center-to-center distance (pitch) between electrode fingers 3 and 4: about 3 μm
Width of each of electrode fingers 3 and 4: about 500 nm
d/p: about 0.133
Dielectric layer 7: silicon oxide film of about 1 μm thickness
Support substrate 8: Si The excitation region C (see FIG. 1B) is a region where the electrode fingers 3 and 4 overlap each other when viewed in the X-direction orthogonal or substantially orthogonal to the length direction of the electrode fingers 3 and 4. The length of the excitation region C is a dimension of the excitation region C in the length direction of the electrode fingers 3 and 4. Here, the excitation region C is an example of an "intersecting region".

In the first preferred embodiment, inter-electrode distances of the electrode pairs each including the electrode fingers 3 and 4 are set to be equal or substantially equal in all the pairs. That is, the electrode fingers 3 and 4 are arranged with equal or substantially equal pitches.

As is apparent from FIG. 5, good resonance characteristics with a fractional bandwidth of, for example, about 12.5% are obtained even though no reflector is provided.

In the first preferred embodiment, d/p is, for example, about 0.5 or less, more preferably about 0.24 or less when d represents the thickness of the piezoelectric layer 2 and p represents the center-to-center distance between electrodes of the electrode fingers 3 and 4. This will be explained with reference to FIG. 6.

Figure 6:
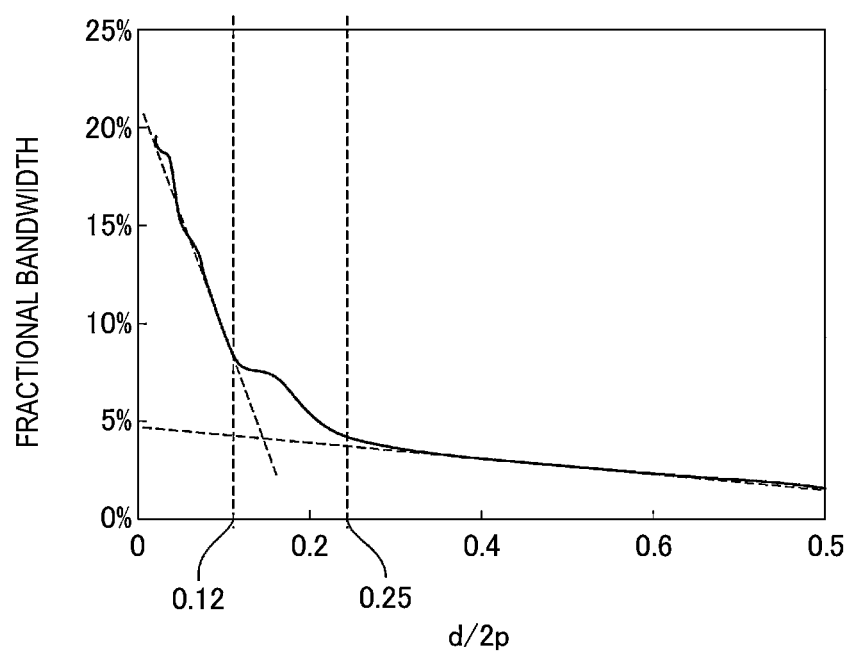
FIG. 6 is a graph illustrating a relationship between d/2p and a fractional bandwidth as a resonator in the acoustic wave device of the first preferred embodiment, where p represents a center-to-center distance or an average center-to-center distance between electrodes adjacent to each other and d represents an average thickness of a piezoelectric layer.

Multiple acoustic wave devices were obtained in the same manner as the acoustic wave device having the resonance characteristics illustrated in FIG. 5, except that d/2p was changed. FIG. 6 is a graph illustrating a relationship between d/2p and a fractional bandwidth as a resonator in the acoustic wave device of the first preferred embodiment, where p represents a center-to-center distance or an average center-to-center distance between electrodes adjacent to each other and d represents an average thickness of the piezoelectric layer 2.

As illustrated in FIG. 6, when d/2p exceeds, for example, about 0.25, that is, when d/p>about 0.5, the fractional bandwidth is less than about 5% even when d/p is adjusted. Meanwhile, when d/2p about 0.25, that is d/p≤about 0.5, the fractional bandwidth may be set to about 5% or more by changing d/p within that range, that is, a resonator having a high coupling coefficient may be provided. When d/2p is, for example, about 0.12 or less, that is, d/p is about 0.24 or less, the fractional bandwidth may be increased to about 7% or more. Further, when d/p is adjusted within that range, a resonator having an even wider fractional bandwidth may be obtained, that is, a resonator having an even higher coupling coefficient may be achieved. Therefore, it is understood that a resonator having a high coupling coefficient using the above-described bulk wave of a thickness-shear primary mode may be provided by setting d/p to about 0.5 or less, for example.

The at least one pair of electrodes may be one pair, and in a case of one pair of electrodes, the above-described p is the center-to-center distance between the electrode fingers 3 and 4 adjacent to each other. Further, in a case of 1.5 or more pairs of electrodes, the average center-to-center distance between the electrode fingers 3 and 4 adjacent to each other is set to p.

Furthermore, as for the thickness d of the piezoelectric layer 2, when the piezoelectric layer 2 has variations in thickness, a value obtained by averaging the thicknesses is used.

Figure 7:
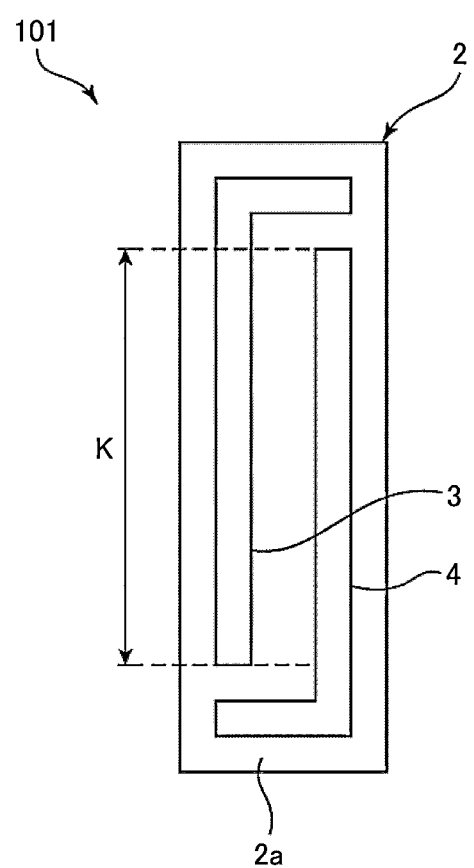
FIG. 7 is a plan view of the acoustic wave device of the first preferred embodiment of the present invention illustrating an example in which a pair of electrodes is provided.

FIG. 7 is a plan view of the acoustic wave device of the first preferred embodiment illustrating an example in which a pair of electrodes is provided. In an acoustic wave device 101, a pair of electrodes including electrode fingers 3 and 4 is provided on the first main surface 2a of the piezoelectric layer 2. K in FIG. 7 is an intersecting width. As described above, in the acoustic wave device of the present preferred embodiment, the number of pairs of electrodes may be one. In the case above as well, when d/p is, for example, about 0.5 or less, a bulk wave of a thickness-shear primary mode may effectively be excited.

In the acoustic wave device 1, it is preferable that the metallization ratio MR satisfies, for example, MR about 1.75 (d/p)+0.075 in the electrode fingers 3 and 4. The metallization ratio MR is a ratio of the electrode fingers 3 and 4 adjacent to each other to the excitation region C being a region where any electrode fingers 3 and 4 adjacent to each other overlap each other when viewed in the facing direction. In the case above, the spurious component may be effectively reduced. This will be explained with reference to FIG. 8 and FIG. 9.

Figure 8:
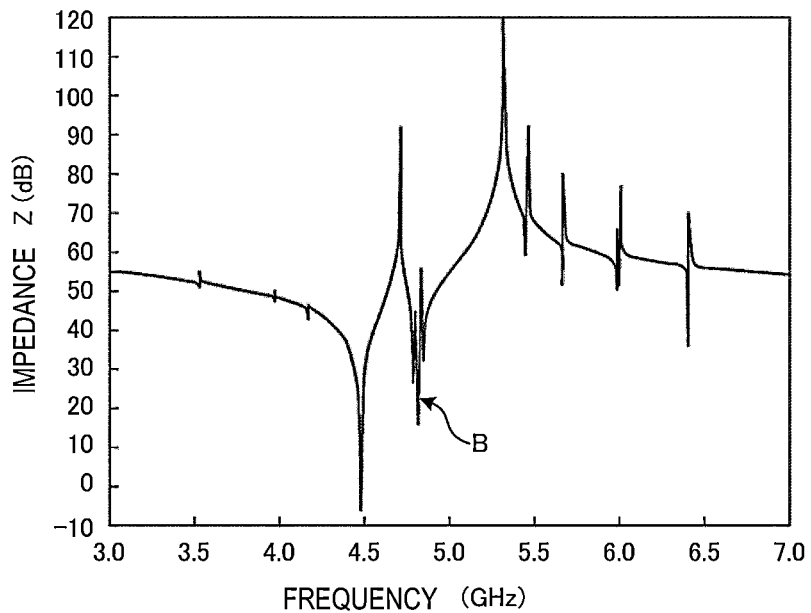
FIG. 8 is a reference graph illustrating an example of a resonance characteristic of the acoustic wave device of the first preferred embodiment of the present invention.

FIG. 8 is a reference graph illustrating an example of a resonance characteristic of the acoustic wave device of the first preferred embodiment. A spurious component indicated by an arrow B appears between a resonant frequency and an anti-resonant frequency. Note that d/p=about 0.08, and Euler angles of LiNbO$_3$ were set to (0°, 0°, 90°). Further, the metallization ratio MR was set to about 0.35, for example.

The metallization ratio MR is explained with reference to FIG. 1B. When attention is paid to one pair of the electrode fingers 3 and 4 in an electrode structure in FIG. 1B, it is assumed that only the one pair of the electrode fingers 3 and 4 is provided. In the case above, a portion surrounded by a dashed-and-dotted line is the excitation region C. The excitation region C is a region of the electrode finger 3 overlapping the electrode finger 4, a region of the electrode finger 4 overlapping the electrode finger 3, and a region where the electrode finger 3 and the electrode finger 4 overlap each other in a region between the electrode fingers 3 and 4, when the electrode fingers 3 and 4 are viewed in the direction orthogonal or substantially orthogonal to the length direction of the electrode fingers 3 and 4, that is, in the facing direction. An area of the electrode fingers 3 and 4 in the excitation region C relative to an area of the excitation region C is the metallization ratio MR. That is, the metallization ratio MR is a ratio of the area of a metallization portion to the area of the excitation region C.

When multiple pairs of electrode fingers 3 and 4 are provided, MR may be defined as a ratio of the metallization portion included in the entire excitation region C to the total area of the excitation region C.

Figure 9:
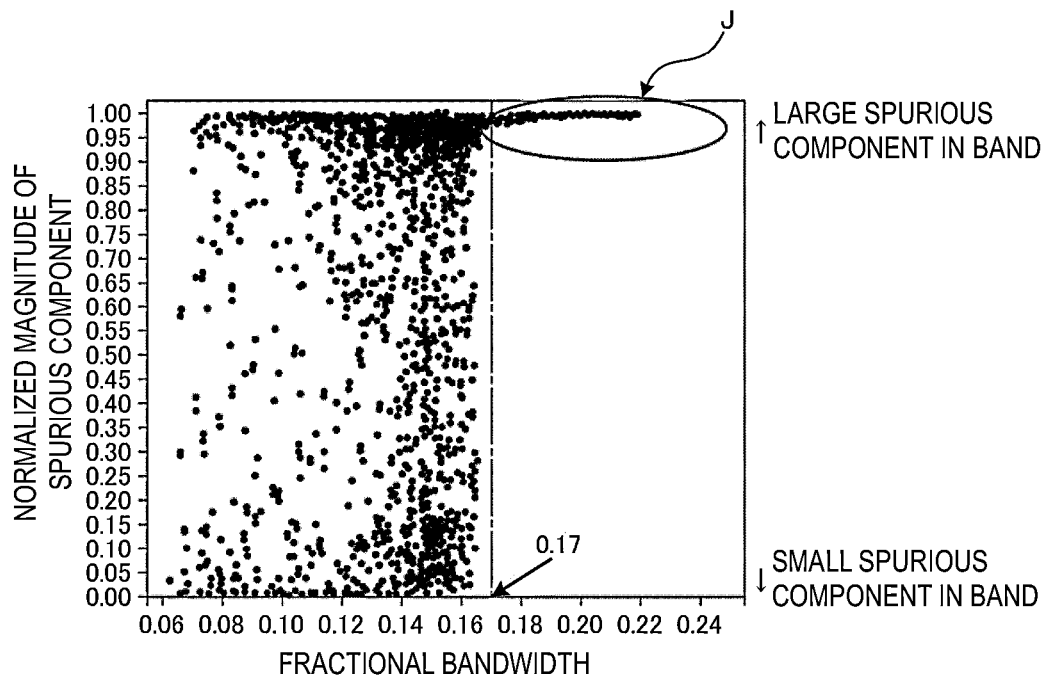
FIG. 9 is a chart illustrating a relationship between a fractional bandwidth and a phase rotation amount of impedance of a spurious component normalized by about 180 degrees as a magnitude of the spurious component, when a large number of acoustic wave resonators are included in the acoustic wave device of the first preferred embodiment of the present invention.

FIG. 9 is a chart illustrating a relationship between a fractional bandwidth and a phase rotation amount of impedance of a spurious component normalized by about 180 degrees as a magnitude of the spurious component, when a large number of acoustic wave resonators are included in the acoustic wave device of the first preferred embodiment. The fractional bandwidth was adjusted by variously changing the thickness of the piezoelectric layer 2 and dimensions of the electrode fingers 3 and 4. Further, although the results obtained by using the piezoelectric layer 2 made of the Z-cut LiNbO$_3$ are illustrated in FIG. 9, the same tendency is obtained when the piezoelectric layer 2 having another cut angle is used.

In a region surrounded by an ellipse J in FIG. 9, the spurious component is as large as about 1.0, for example. As is apparent from FIG. 9, when the fractional bandwidth exceeds 0.17, that is, when the fractional bandwidth exceeds about 17%, a large spurious component having a spurious level of about 1 or more appears in a pass band even when the parameters constituting the fractional bandwidth are changed. That is, as in the resonance characteristics illustrated in FIG. 8, a large spurious component indicated by the arrow B appears in the band. Therefore, the fractional bandwidth is preferably, for example, about 17% or less. In the case above, the spurious component may be reduced by adjusting the thickness of the piezoelectric layer 2, the dimensions of the electrode fingers 3 and 4, and the like.

Figure 10:
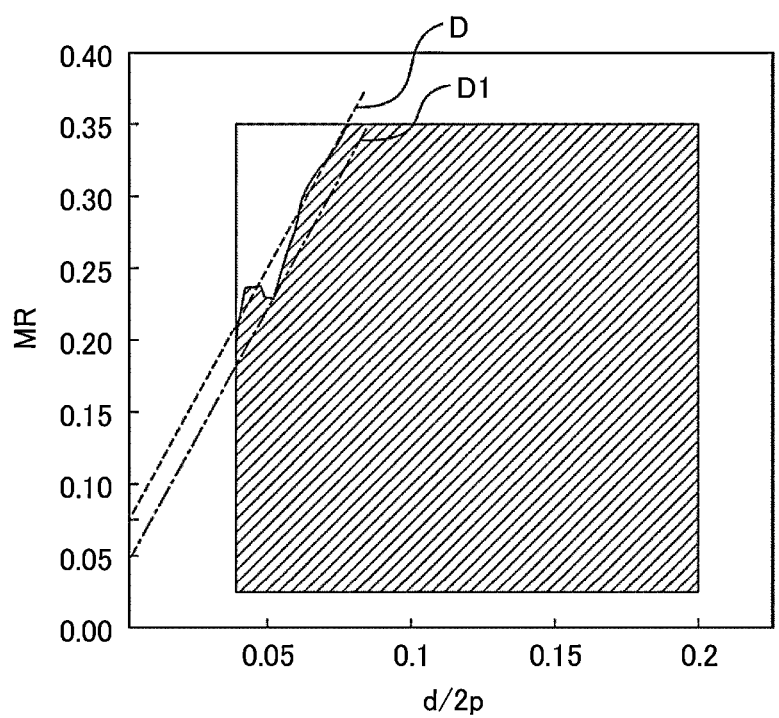
FIG. 10 is a chart illustrating a relationship between d/2p, a metallization ratio MR, and a fractional bandwidth.

FIG. 10 is a chart illustrating a relationship between d/2p, metallization ratio MR, and a fractional bandwidth. In the acoustic wave device 1 of the first preferred embodiment, various acoustic wave devices 1 having different d/2p and different MR were provided, and the fractional bandwidth was measured. A hatched portion on the right side of a broken line D in FIG. 10 is a region where the fractional bandwidth is, for example, about 17% or less. The boundary between the hatched region and the non-hatched region is represented by, for example, MR=about 3.5 (d/2p)+0.075. That is, MR=about 1.75 (d/p)+0.075. Therefore, MR about 1.75 (d/p)+0.075 is preferable. In the case above, the fractional bandwidth is likely to be about 17% or less. The region on the right side of MR=about 3.5 (d/2p)+0.05 indicated by the dashed-and-dotted line D1 in FIG. 10 is more preferable. That is, when MR about 1.75 (d/p)+0.05, the fractional bandwidth may reliably be set to about 17% or less.

Figure 11:
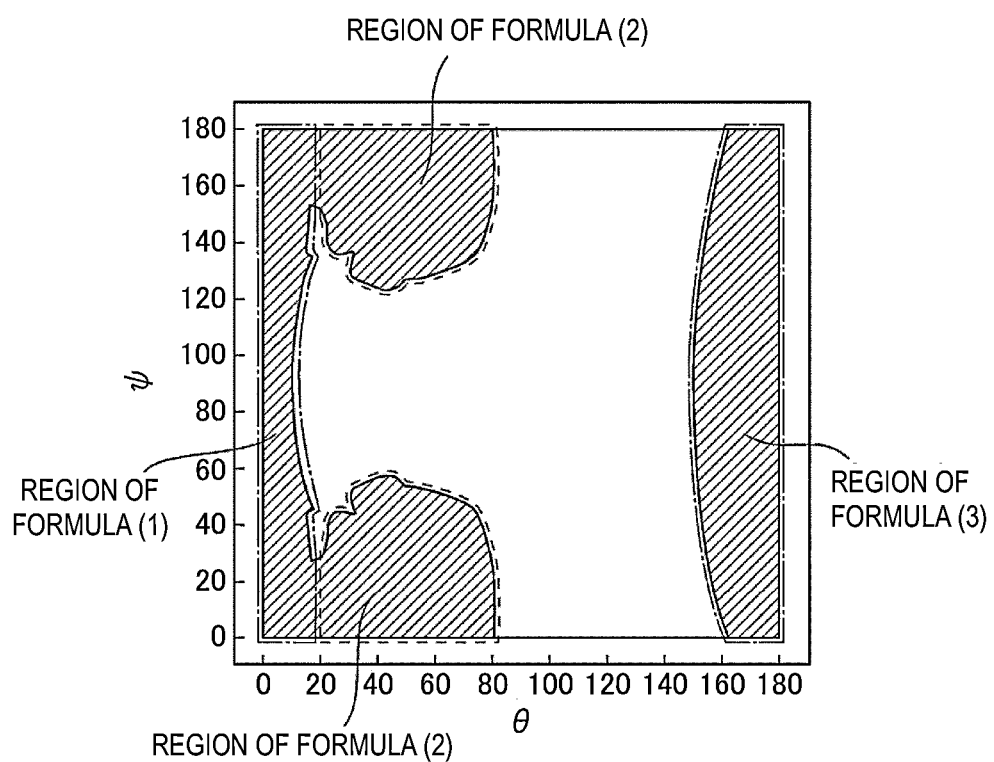
FIG. 11 is a chart illustrating a map of a fractional bandwidth relative to Euler angles (0°, θ, ψ) of $LiNbO_3$ when d/p is as close to 0 as possible.

FIG. 11 is a chart illustrating a map of a fractional bandwidth relative to Euler angles (0°, θ, ψ) of LiNbO$_3$ when d/p is as close to 0 as possible. A hatched portion in FIG. 11 is a region where a fractional bandwidth of at least about 5% or more is obtained. When the range of the region is approximated, the range is expressed by formula (1), formula (2), and formula (3) below.

$(0°\pm10°, 0°$ to $20°,$ any $\psi)$      Formula (1)

$(0°\pm10°, 20°$ to $80°, 0°$ to $60°(1-(\theta-50)^2/900)^{1/2})$ or $(0°\pm10°, 20°$ to $80°, [180°-60°(1-(\theta-50)^2/900)^{1/2}]$ to $180°)$      Formula (2)

$(0°\pm10°, [180°-30°(1-(\psi-90)^2/8100)^{1/2}]$ to $180°,$ any $\psi)$      Formula (3)

Therefore, in a case that Euler angles are in the range of formula (1), formula (2) or formula (3) described above, the fractional bandwidth may preferably sufficiently be widened.

Figure 12:
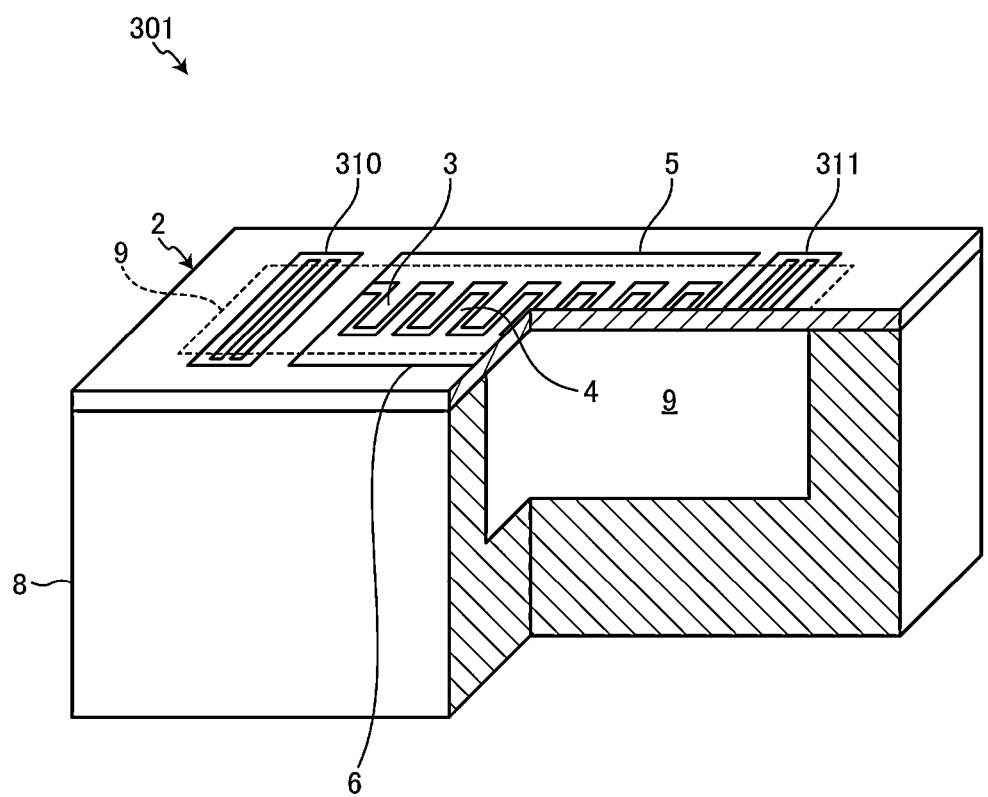
FIG. 12 is a partially cutaway perspective view for describing an acoustic wave device according to another preferred embodiment of the present invention.

FIG. 12 is a partially cutaway perspective view for describing an acoustic wave device according to a preferred embodiment of the present invention. An outer peripheral edge of the space portion 9 is indicated by a broken line in FIG. 12. The acoustic wave device of the present preferred embodiment may use a plate wave. In the case above, an acoustic wave device 301 includes reflectors 310 and 311 as illustrated in FIG. 12. The reflectors 310 and 311 are provided on both sides of the electrode fingers 3 and 4 of the piezoelectric layer 2 in an acoustic wave propagation direction. A Lamb wave as a plate wave is excited by applying an AC voltage to the electrode fingers 3 and 4 above the space portion 9 in the acoustic wave device 301. At this time, since the reflectors 310 and 311 are provided on both sides, resonance characteristics by a Lamb wave as a plate wave may be obtained.

As described above, in the acoustic wave devices 1 and 101, a bulk wave of a thickness-shear primary mode is used. Further, in the acoustic wave devices 1 and 101, the first electrode finger 3 and the second electrode finger 4 are electrodes adjacent to each other, and d/p is, for example, about 0.5 or less when d represents the thickness of the piezoelectric layer 2 and p represents the center-to-center distance between the first electrode finger 3 and the second electrode finger 4. As a result, even when an acoustic wave device is reduced in size, the Q factor may be higher.

In the acoustic wave devices 1 and 101, the piezoelectric layer 2 is made of, for example, lithium niobate or lithium tantalate. On the first main surface 2a or the second main surface 2b of the piezoelectric layer 2, the first electrode finger 3 and the second electrode finger 4 facing each other in a direction intersecting the thickness direction of the piezoelectric layer 2 are provided, and the first electrode finger 3 and the second electrode finger 4 are preferably covered with a protection film.

Figure 13:
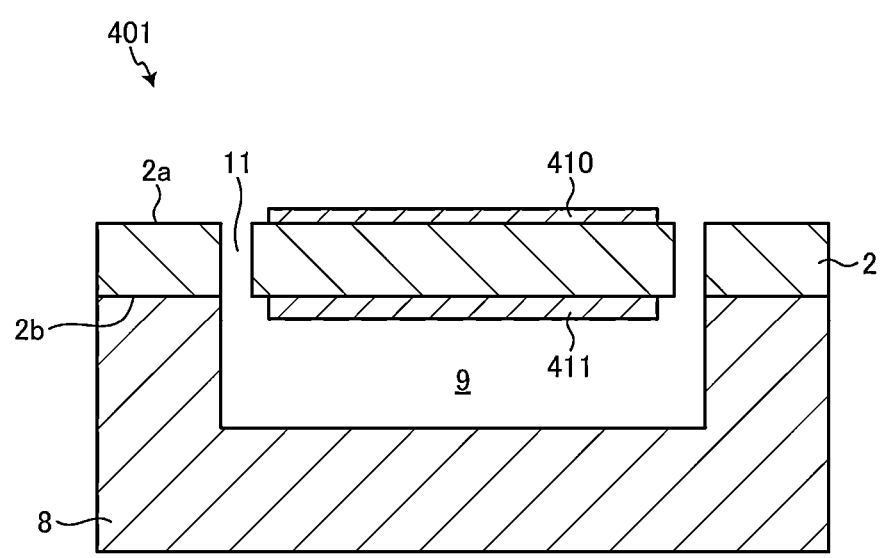
FIG. 13 is a sectional view for describing the acoustic wave device according to the other preferred embodiment of the present invention.

FIG. 13 is a sectional view for describing the acoustic wave device according to a preferred embodiment of the present invention. The acoustic wave device of the present preferred embodiment may be a device using a bulk wave as illustrated in FIG. 13, that is, a bulk acoustic wave (BAW) element. In the case above, an acoustic wave device 401 includes functional electrodes 410 and 411. The functional electrodes 410 and 411 are electrodes provided on both sides in the thickness direction of the piezoelectric layer 2. In the example of FIG. 13, the support substrate 8 includes a space portion 9 on the piezoelectric layer 2 side, and the functional electrode 411 is provided in the space portion 9.

In the example of FIG. 13, a through-hole 11 is provided in the piezoelectric layer 2. The through-hole 11 is a hole extending through the piezoelectric layer 2 in the Z-direction. The through-hole 11 communicates with the space portion 9. Providing the through-hole 11 in the piezoelectric layer 2 makes it possible to etch a sacrificial layer provided in the space portion 9 in advance before bonding, by pouring an etching liquid from the through-hole 11 after bonding the piezoelectric layer 2 to the support substrate 8.

Figure 14:
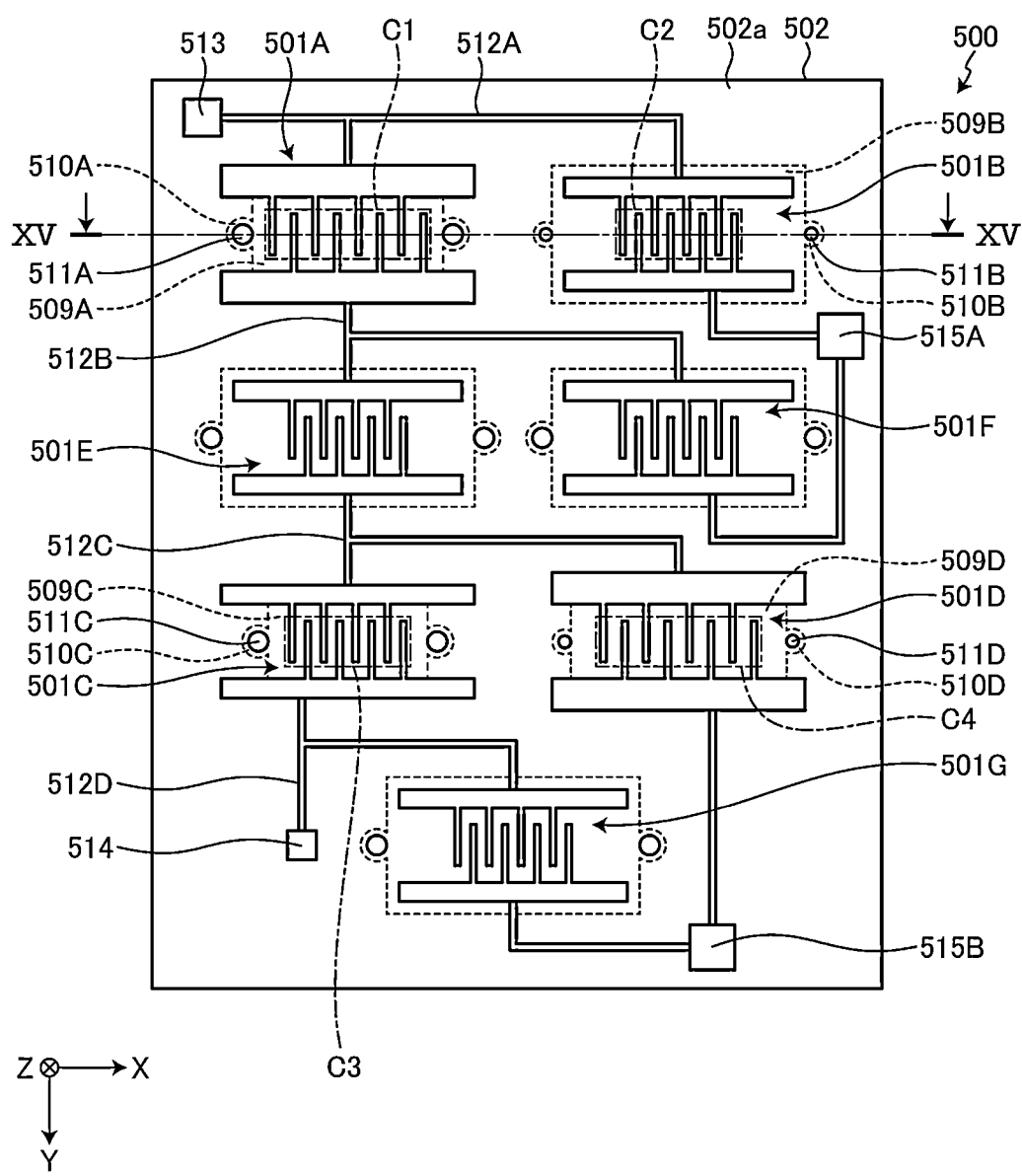
FIG. 14 is a plan view of the acoustic wave device according to the first preferred embodiment of the present invention illustrating an example thereof.
Figure 15:
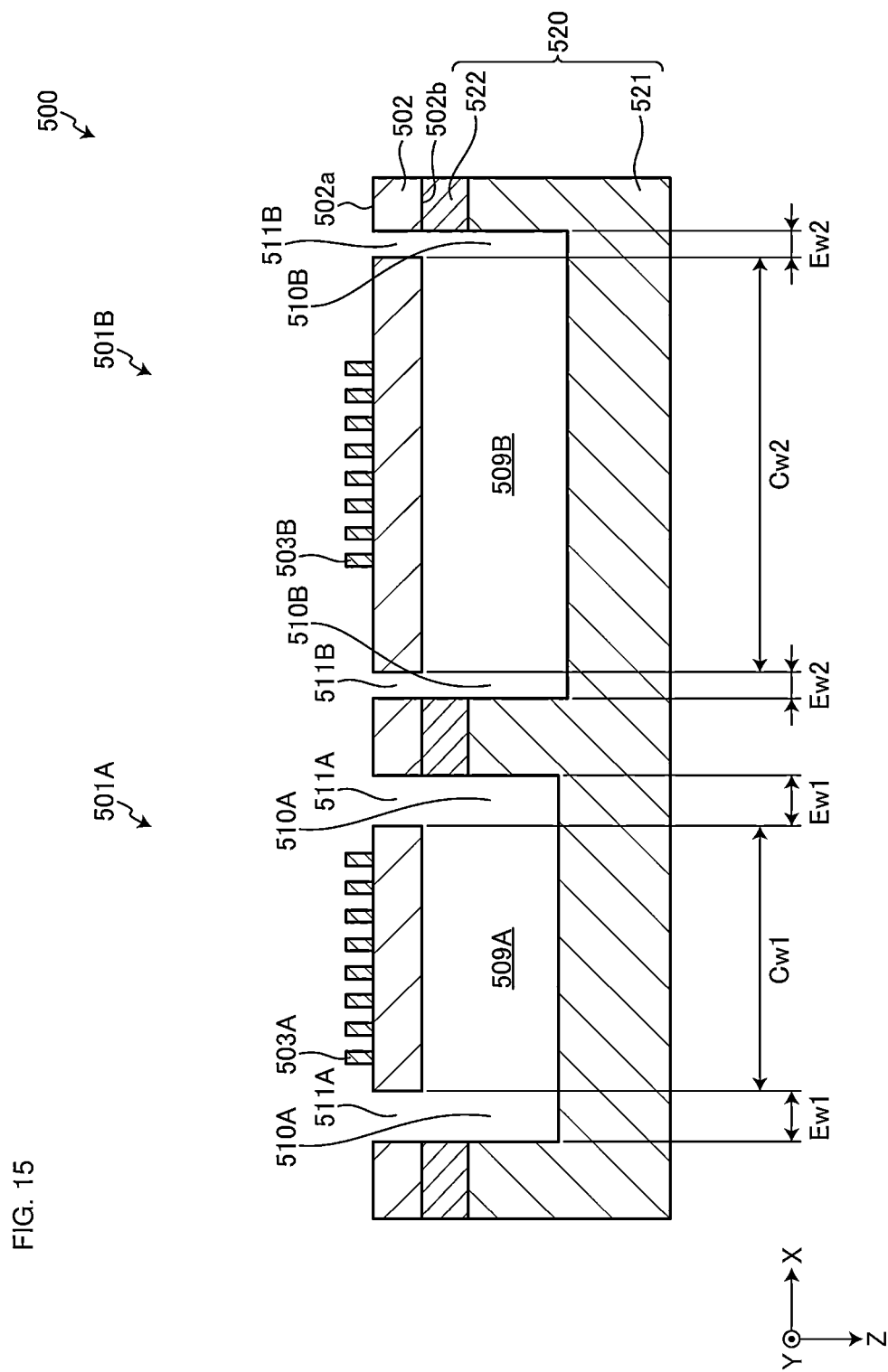
FIG. 15 is a sectional view taken along line XV-XV in FIG. 14.

FIG. 14 is a plan view of an example of the acoustic wave device according to the first preferred embodiment. FIG. 15 is a sectional view taken along line XV-XV in FIG. 14. As illustrated in FIG. 14 and FIG. 15, an acoustic wave device 500 according to the first preferred embodiment includes multiple resonators 501A to 501G. The acoustic wave device 500 includes a support 520, a piezoelectric layer 502, wiring electrodes 512A to 512C, an input terminal 513, an output terminal 514, and grounds 515A and 515B.

The piezoelectric layer 502 is provided on the support 520. The piezoelectric layer 502 includes a first main surface 502a and a second main surface 502b. In the present preferred embodiment, the first main surface 502a is a surface on which the resonators 501A to 501F and the wiring electrodes 512A to 512C are provided. Meanwhile, the second main surface 502b is a surface on which the support 520 is provided. A material of the piezoelectric layer 502 may include, for example, lithium niobate (LiNbO$_3$) or lithium tantalate (LiTaO$_3$) and an impurity.

The support 520 includes a support substrate 521 and a dielectric layer 522 as illustrated in FIG. 15. A material of the support substrate 521 is silicon, for example. The dielectric layer 522 is provided on the support substrate 521 on a piezoelectric layer 502 side. A material of the dielectric layer 522 is silicon oxide, for example.

Each of the resonators 501A to 501F includes a functional electrode and a portion of a multilayer body at least partially overlapping the functional electrode in plan view in the Z-direction. Here, the functional electrode refers to an IDT electrode including a first electrode finger, a second electrode finger, a first busbar electrode, and a second busbar electrode. Further, the multilayer body includes a portion of the piezoelectric layer 502 and a portion of the support 520. Hereinafter, the resonators 501A and 501C may be referred to as a first resonator, and the resonators 501B and 501D may be referred to as a second resonator.

In the present preferred embodiment, the resonators 501A and 501B include electrode fingers 503A and 503B as the first and second electrode fingers of the functional electrodes. That is, the electrode fingers 503A and 503B correspond to the first electrode finger and the second electrode finger of the resonators 501A and 501B, respectively. The electrode fingers 503A and 503B each have a length direction in the Y-direction. End portions in the Y-direction are connected to the first busbar electrode and the second busbar electrode.

An electrode area of the resonator 501A is larger than an electrode area of the resonator 501B, and an electrode area of the resonator 501C is smaller than an electrode area of the resonator 501D. Here, the electrode area of each of the resonators 501A to 501D refers to an area of each of intersecting regions C1 to C4 in which multiple first and second electrode fingers of the resonators overlap each other when viewed in a direction in which the electrode fingers are arranged. That is, the area of the intersecting region C1 of the resonator 501A is larger than the area of the intersecting region C2 of the resonator 501B, and the area of the intersecting region C3 of the resonator 501C is smaller than the area of the intersecting region C4 of the resonator 501D.

The wiring electrodes 512A to 512C are wiring lines to electrically connect the resonators 501A to 501F. The wiring electrodes 512A to 512D are provided on the piezoelectric layer 502. The wiring electrodes 512A to 512D are electrically connected to the busbar electrodes of the resonators 501A to 501F.

Figure 16:
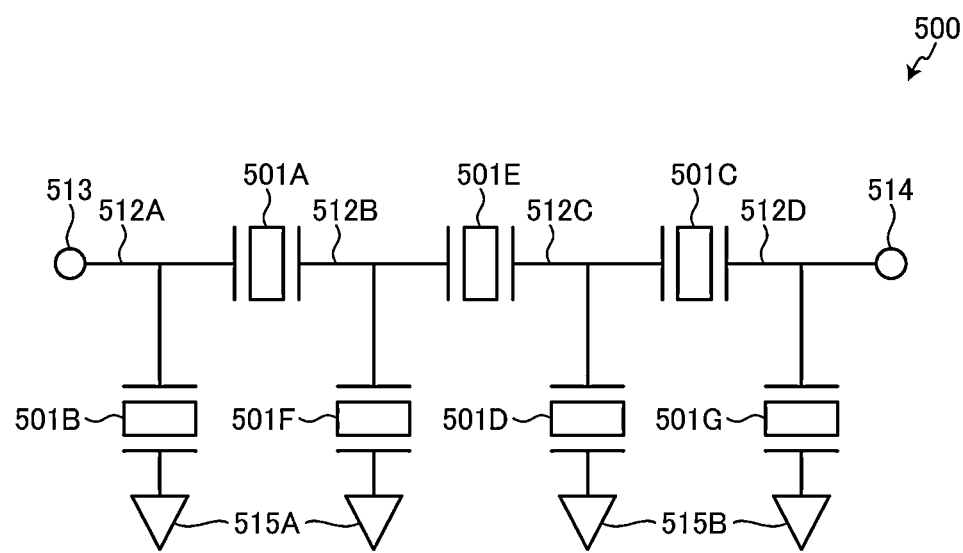
FIG. 16 is a circuit diagram of the acoustic wave device according to the first preferred embodiment of the present invention in FIG. 14.

FIG. 16 is a circuit diagram of the acoustic wave device according to the first preferred embodiment illustrated in FIG. 14. As illustrated in FIG. 16, the acoustic wave device 500 is a ladder filter including a series arm resonator, inserted in series in a signal path from the input terminal 513 to the output terminal 514, and a parallel arm resonator, inserted in a path between the signal path and the ground. In FIG. 16, the series arm resonators are resonators 501A, 501E, and 501C. In each of the resonators 501A, 501E, and 501C which are series arm resonators, one terminal is electrically connected to the input terminal 513 and the other terminal is electrically connected to the output terminal 514. Here, the resonators 501A, 501E and 501C are electrically connected in series. Meanwhile, the parallel arm resonators are resonators 501B, 501F, 501D, and 501G in FIG. 16. In the resonator 501B, one terminal is electrically connected to the input terminal 513 via the wiring electrode 512A, and the other terminal is electrically connected to the ground 515A. In the resonator 501F, one terminal is electrically connected to the wiring electrode 512B connecting the resonator 501A and the resonator 501E, and the other terminal is electrically connected to the ground 515A. In the resonator 501D, one terminal is electrically connected to the wiring electrode 512C connecting the resonator 501E and the resonator 501C, and the other terminal is electrically connected to the ground 515B. In the resonator 501G, one terminal is electrically connected to the output terminal 514 via the wiring electrode 512D, and the other terminal is electrically connected to the ground 515B.

In the acoustic wave device 500 according to the present preferred embodiment, the first resonators 501A and 501C are not limited to series arm resonators, and the second resonators 501B and 501D are not limited to parallel arm resonators. For example, the first resonators 501A and 501C may be parallel arm resonators, and the second resonators 501B and 501D may be series arm resonators. Further, the acoustic wave device 500 may include a resonator for transmission and a resonator for reception. In the case above, the first resonators 501A and 501C may be resonators for transmission, and the second resonators 501B and 501D may be resonators for reception. Further, the first resonators 501A and 501C may be resonators for reception, and the second resonators 501B and 501D may be resonators for transmission.

Here, the resonators 501A to 501D respectively include space portions 509A to 509D and extended portions 510A to 510D provided to the support 520 being a portion of a multilayer body on the piezoelectric layer 502 side. For example, the space portion 509A and the extended portion 510A are provided to the support 520 being a portion of the multilayer body of the resonator 501A on the piezoelectric layer 502 side.

The space portions 509A to 509D are cavities provided to the support 520 on the piezoelectric layer 502 side. The space portions 509A to 509D are provided at respective positions at least partially overlapping the functional electrode of the resonators 501A to 501D in plan view in the Z-direction. That is, each of the resonators 501A to 501D includes a corresponding one of the space portions 509A to 509D in the support 520 of the multilayer body. Here, the space portions 509A and 509C are an example of a "first space portion", and the space portions 509B and 509D are an example of a "second space portion".

An area of the space portion 509A in plan view in the Z-direction is smaller than an area of the space portion 509B in plan view in the Z-direction. In the example of FIG. 15, a length Cw1 of the space portion 509A in the X-direction is smaller than a length Cw2 of the space portion 509B in the X-direction. As a result, since the resonator 501A having the electrode area larger than the resonator 501B includes the space portion 509A having the area smaller than the space portion 509B, a heat dissipation property may be improved.

In the example of FIG. 14, an area of the space portion 509C in plan view in the Z-direction is smaller than an area of the space portion 509D in plan view in the Z-direction. As a result, since the resonator 501D having the electrode area larger than the resonator 501C includes the space portion 509D having the area larger than the space portion 509C, the excitation space may be easily secured.

The space portion 509A and the space portion 509B, or the space portion 509C and the space portion 509D may have different depths, that is, different lengths in the Z-direction. For example, the depths of the second space portions 509B and 509D having a large area in plan view in the Z-direction may be deeper than the depths of the first space portions 509A and 509C having a small area in plan view in the Z-direction.

The extended portions 510A to 510D are cavities provided to the support 520 on the piezoelectric layer 502 side. The extended portions 510A to 510D are provided at respective positions not overlapping the space portions 509A to 509D in plan view in the Z-direction. The extended portions 510A to 510D communicate with the space portions 509A to 509D, respectively. In the example of FIG. 14, the extended portions 510A to 510D are provided so as to communicate with the respective space portions 509A to 509D on both sides in the X-direction. Hereinafter, the extended portions 510A and 510C may be described as a first extended portion, and the extended portions 510B and 510D may be described as a second extended portion.

Through-holes 511A to 511D which are holes extending through in the Z-direction are provided to the piezoelectric layer 502. The through-holes 511A to 511D are provided so as to overlap the respective extended portions 510A to 510D in plan view in the Z-direction. That is, the through-holes 511A to 511D respectively communicate with the extended portions 510A to 510D in the Z-direction. Here, the through-holes 511A and 511C are an example of a "first through-hole", and the through-holes 511B and 511D are an example of a "second through-hole".

An area of each of the first through-holes 511A and 511C is larger than an area of each of the second through-holes 511B and 511D. Here, an area of a through-hole refers to the total sum of areas occupied by openings of the through-holes provided to the piezoelectric layer 502 in plan view in the Z-direction. For example, since two through-holes 511A are provided in the piezoelectric layer 502 in the example of FIG. 14, the area of the through-hole 511A is the sum of the areas occupied by the openings of the two through-holes in plan view in the Z-direction. In the example illustrated in FIG. 15, a width Ew1 of the first through-hole 511A in the X-direction is larger than a width Ew2 of the second through-hole 511B. Here, a width of a through-hole refers to a length of an opening of one through-hole in the X-direction.

Here, in the manufacturing process of the acoustic wave device 500, sticking, being a phenomenon in which the piezoelectric layer 502 is bent and sticks to an inner wall of a space portion due to surface tensions, is likely to occur when the liquid in the space portion is dried during etching, since the second space portions 509B and 509D each have a large area. The second space portions 509B and 509D according to the present preferred embodiment respectively communicate with the second through-holes 511B and 511D having a small area. As a result, the evaporation of the liquid in the second space portions 509B and 509D through the second through-holes 511B and 511D may be slow, and the inside of the second space portions 509B and 509D may be dried slowly. Therefore, the occurrence of sticking may be reduced or prevented.

Meanwhile, in the manufacturing process of the acoustic wave device 500, the sticking is less likely to occur in the first space portions 509A and 509C, having a small area, when the liquid in the space portion is dried during etching. The first space portions 509A and 509C according to the present preferred embodiment respectively communicate with the first through-holes 511A and 511C having a large area. As a result, the evaporation of the liquid in the first space portions 509A and 509C through the first through-holes 511A and 511C may be promoted, and the inside of the first space portions 509A and 509C may be dried rapidly. Therefore, manufacturing efficiency may be improved.

The acoustic wave device according to the present preferred embodiment is not limited to the acoustic wave device 500 illustrated in FIG. 14. Hereinafter, modifications of the acoustic wave device according to the present preferred embodiment will be described with reference to the drawings. The same or corresponding components are denoted by the same reference signs, and a description thereof will be omitted.

Figure 17:
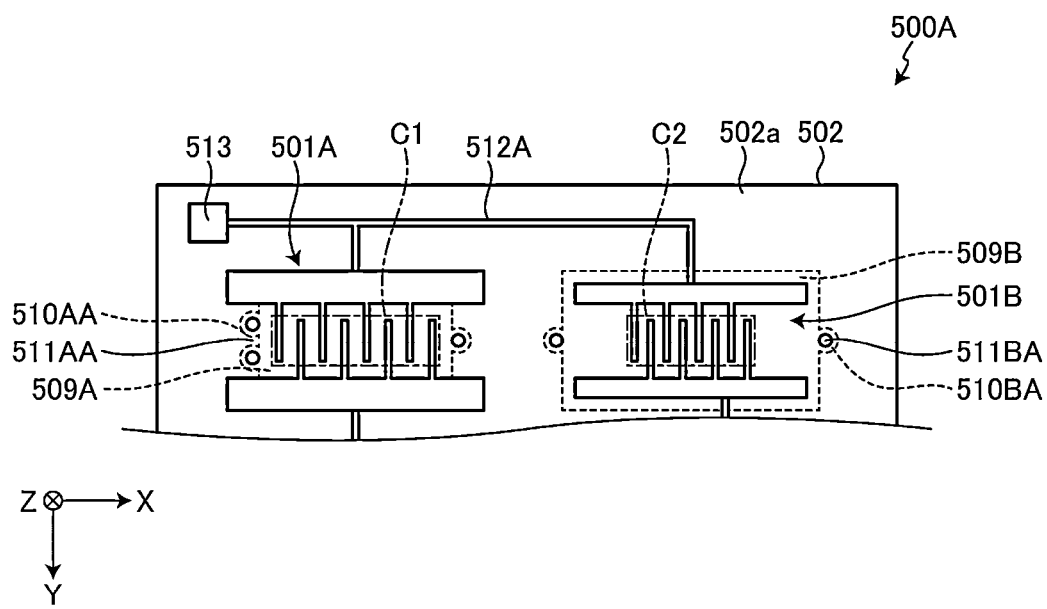
FIG. 17 is a plan view of the acoustic wave device according to the first preferred embodiment of the present invention illustrating a portion of a first modification thereof.
Figure 18:
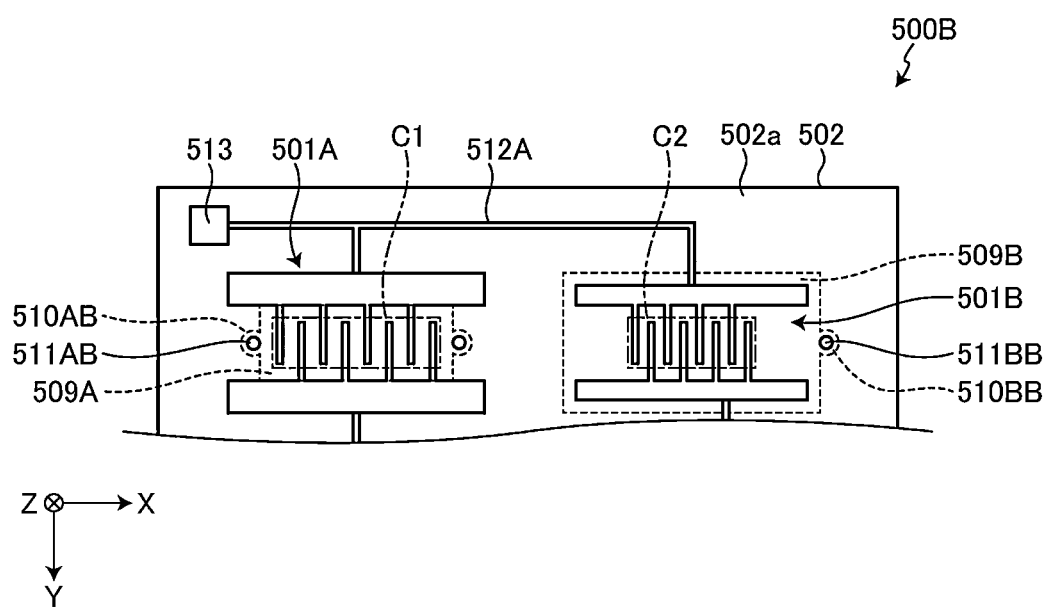
FIG. 18 is a plan view of the acoustic wave device according to the first preferred embodiment of the present invention illustrating a portion of a second modification thereof.

FIG. 17 is a plan view of the acoustic wave device according to the first preferred embodiment illustrating a portion of a first modification thereof. FIG. 18 is a plan view of the acoustic wave device according to the first preferred embodiment illustrating a portion of a second modification thereof. As illustrated in FIG. 17 and FIG. 18, the first through-hole 511A and the second through-hole 511B may include openings with the same or substantially the same area in plan view in the Z-direction, and the width Ew1 of the first through-hole and the width Ew2 of the second through-hole may be equal or substantially equal to each other. In the case above, the number of first through-holes 511A is greater than the number of second through-holes 511B.

In an acoustic wave device 500A according to the first modification, three first through-holes 511AA are provided so as to communicate with the first space portion 509A, and two second through-holes 511BA are provided so as to communicate with the second space portion 509B. Here, two first through-holes 511AA are provided on one side of the first space portion 509A in the X-direction. As a result, sticking in the second space portion 509B may be reduced or prevented and the drying time of the first space portion 509A may be shortened in manufacturing the acoustic wave device 500A, since an area of the first through-hole 511AA is larger than an area of the second through-hole 511BA.

In an acoustic wave device 500B according to the second modification, two first through-holes 511AB are provided so as to communicate with the first space portion 509A, and one second through-hole 511BB is provided so as to communicate with the second space portion 509B. Here, the second through-hole 511BB is provided only on one side of the second space portion 509B in the X-direction. As a result, sticking in the second space portion 509B may be reduced or prevented and the drying time of the first space portion 509A may be shortened in manufacturing the acoustic wave device 500B, since an area of the first through-hole 511AB is larger than an area of the second through-hole 511BB.

Figure 19:
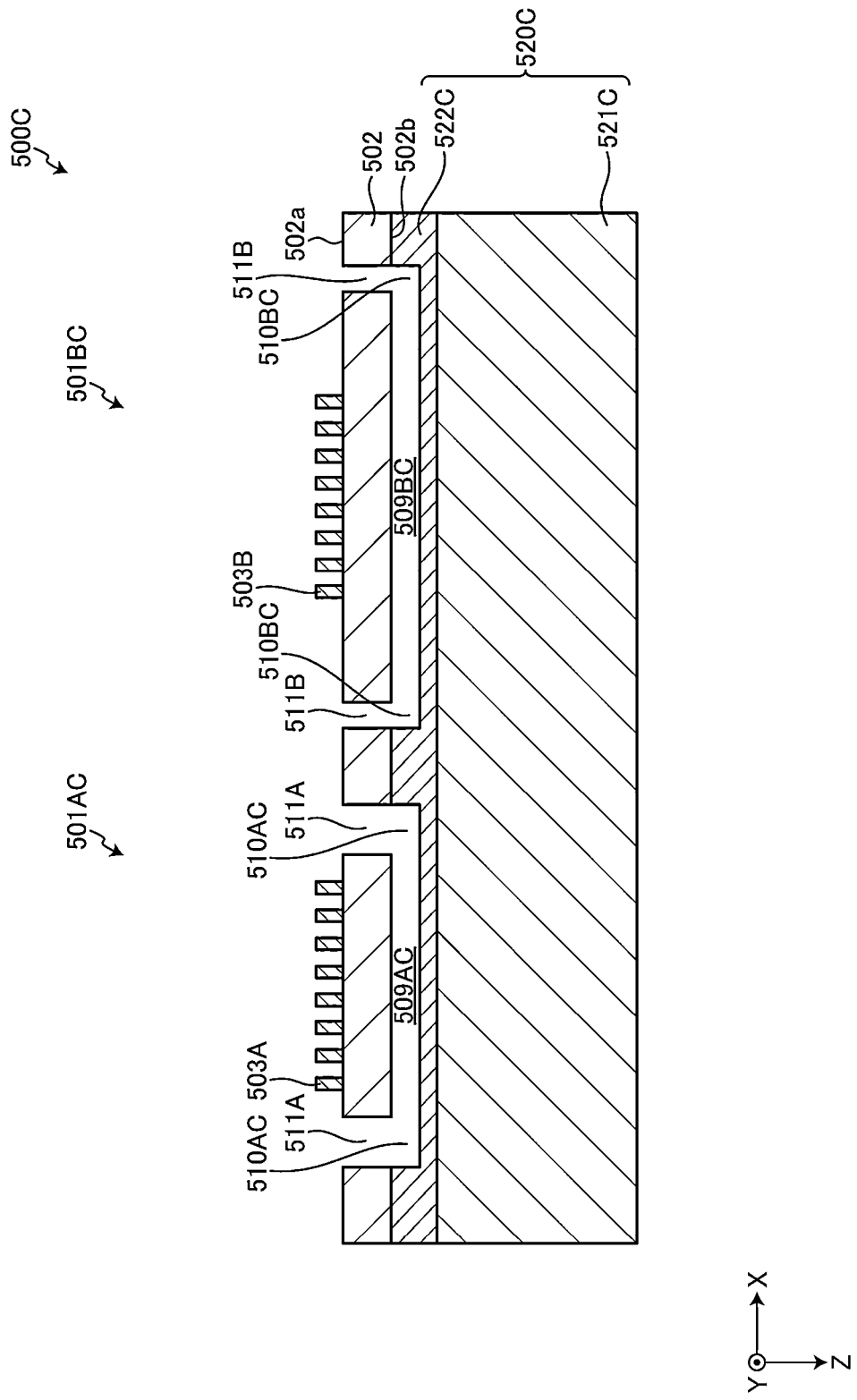
FIG. 19 is a sectional view of the acoustic wave device according to the first preferred embodiment of the present invention illustrating a third modification thereof.
Figure 20:
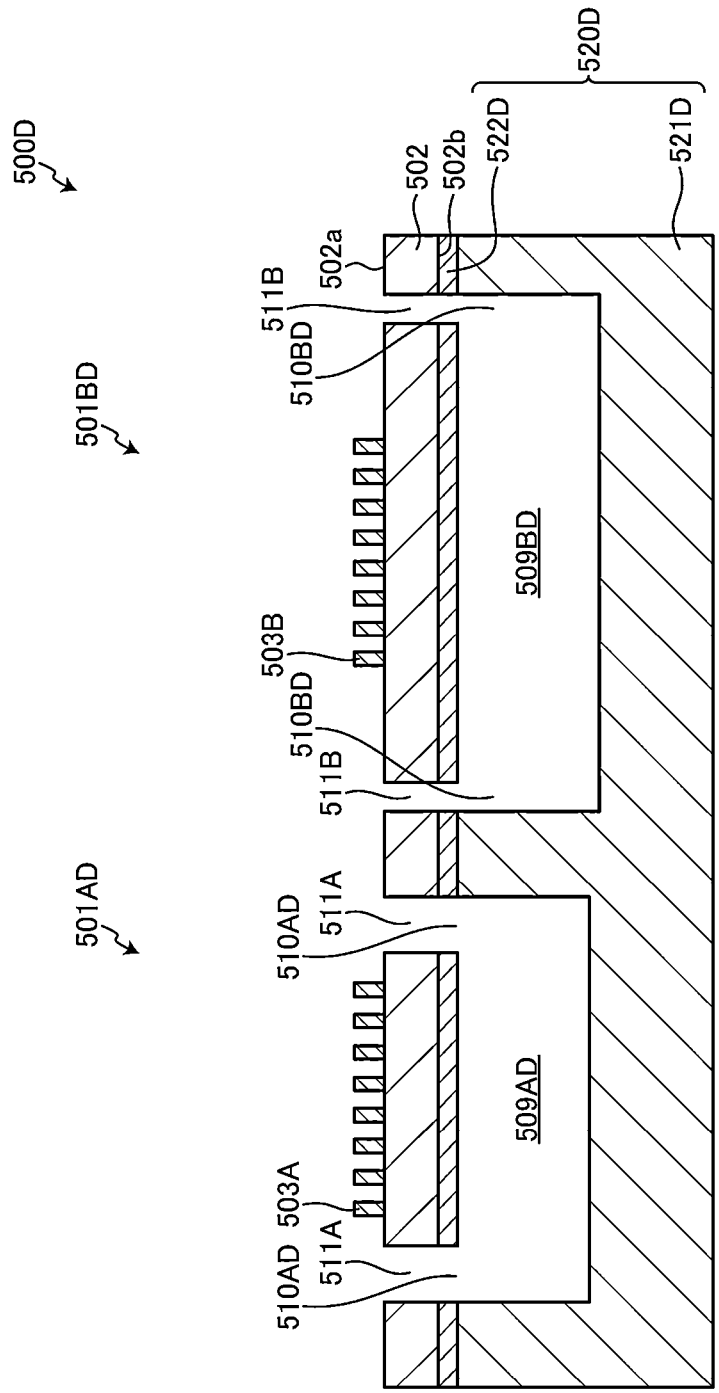
FIG. 20 is a sectional view of the acoustic wave device according to the first preferred embodiment of the present invention illustrating a fourth modification thereof.
Figure 21:
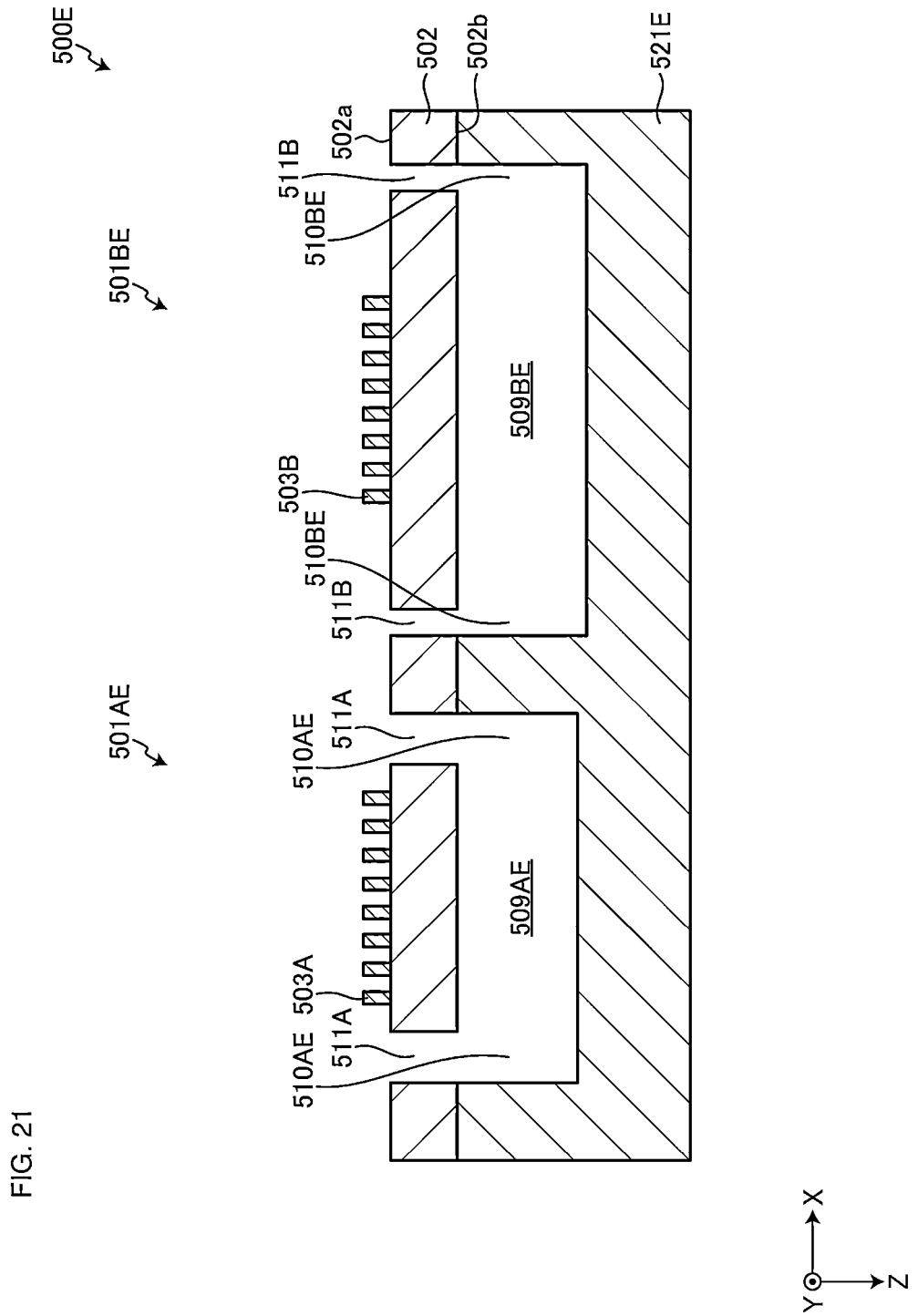
FIG. 21 is a sectional view of the acoustic wave device according to the first preferred embodiment of the present invention illustrating a fifth modification thereof.

FIG. 19 is a sectional view of the acoustic wave device according to the first preferred embodiment illustrating a third modification thereof. FIG. 20 is a sectional view of the acoustic wave device according to the first preferred embodiment illustrating a fourth modification thereof. FIG. 21 is a sectional view of the acoustic wave device according to the first preferred embodiment illustrating a fifth modification thereof. Here, FIG. 19 to FIG. 21 are sectional views of the acoustic wave device according to respective modifications corresponding to FIG. 15. As illustrated in FIG. 19 to FIG. 21, the configuration of the support 520 is not limited to the configuration illustrated in FIG. 15.

In an acoustic wave device 500C according to the third modification, a first space portion 509AC, a second space portion 509BC, a first extended portion 510AC, and a second extended portion 510BC are provided to a dielectric layer 522C on the piezoelectric layer 502 side in the Z-direction as illustrated in FIG. 19. In the case above as well, the sticking in the second space portion 509BC may be reduced or prevented, and the drying time of the first space portion 509AC may be shortened in manufacturing the acoustic wave device 500C.

In an acoustic wave device 500D according to the fourth modification, a first space portion 509AD and a second space portion 509BD are provided to a support substrate 521D on the piezoelectric layer 502 side in the Z-direction as illustrated in FIG. 20. Further, a first extended portion 510AD and a second extended portion 510BD are provided to a support 520D so as to extend through a dielectric layer 522D in the Z-direction. In the case above as well, the sticking in the second space portion 509BD may be reduced or prevented and the drying time of the first space portion 509AD may be shortened in manufacturing the acoustic wave device 500D.

In the acoustic wave device 500E according to the fifth modification, the support is only a support substrate 521E as illustrated in FIG. 21. In the case above, a first space portion 509AE, a second space portion 509BE, a first extended portion 510AE, and a second extended portion 510BE are provided on a support substrate 521E on the piezoelectric layer 502 side in the Z-direction. In the case above as well, the sticking in the second space portion 509BE may be reduced or prevented and the drying time of the first space portion 509AE may be shortened in manufacturing the acoustic wave device 500E.

As described above, the acoustic wave device 500 according to the first preferred embodiment includes the support 520 including the support substrate 521 having a thickness in the first direction, the piezoelectric layer 502 provided on the support 520 in the first direction, and the resonators 501A to 501G each having a functional electrode provided on the piezoelectric layer 502 in the first direction. The support 520 includes the space portions 509A to 509D at positions where the respective resonators at least partially overlap in plan view in the first direction, and the space portions 509A to 509D include the first space portions 509A and 509C and the second space portions 509B and 509D having an area larger than an area of the first space portions 509A and 509C in plan view in the first direction. The piezoelectric layer 502 includes the first through-holes 511A and 511C communicating with the first space portions 509A and 509C, and the second through-holes 511B and 511D communicating with the second space portions 509B and 509D. The first through-holes 511A and 511C have an area larger than an area of the second through-holes 511B and 511D in plan view in the first direction.

As a result, the inside of the second space portions 509B and 509D may be dried slowly in manufacturing of the acoustic wave device 500 since the second space portions 509B and 509D having a large area communicate with the second through-holes 511B and 511D having a small area, and thus, the sticking may be prevented. Meanwhile, the inside of the first space portions 509A and 509C may be dried quickly in manufacturing the acoustic wave device 500 since the first space portions 509A and 509C having a small area communicate with the first through-holes 511A and 511C having a large area, and thus, the drying time may be shortened. Therefore, reduction or prevention of the sticking in the space portion and reduction of the drying time may simultaneously be achieved.

Further, an area of the resonator 501B overlapping the second space portion 509B in plan view in the first direction may be larger than an area of the resonator 501A overlapping the first space portion 509A. In the case above, since the resonator 501A includes the first space portion 509A having the area smaller than the area of the second space portion 509B, the resonator 501A may improve the heat dissipation property.

Further, an area of the resonator 501C overlapping the first space portion 509C in plan view in the first direction may be larger than an area of the resonator 501D overlapping the second space portion 509D. In the case above, since the resonator 501D includes the second space portion 509D having the area larger than the area of the first space portion 509C, the resonator 501D may easily secure the excitation space.

Further, the resonators 501A and 501C overlapping the first space portions 509A and 509C and the resonators 501B and 501D overlapping the second space portions 509B and 509D in plan view in the first direction may be either series arm resonators or parallel arm resonators. In the case above as well, reduction or prevention of the sticking in the space portion and reduction of the drying time may simultaneously be achieved.

Further, the resonators 501A and 501C overlapping the first space portions 509A and 509C and the resonators 501B and 501D overlapping the second space portions 509B and 509D in plan view in the first direction may be either reception resonators or transmission resonators. In the case above as well, reduction or prevention of the sticking in the space portion and reduction of the drying time may simultaneously be achieved.

Preferably, the support 520 includes the extended portion 510A communicating with at least one space portion 509A out of the space portions 509A and 509B at a position not overlapping at least the one space portion 509A in plan view in the first direction, and the piezoelectric layer 502 includes the through-hole 511A extending through the piezoelectric layer 502 at a position overlapping the extended portion 510A in plan view in the first direction. In the case above as well, reduction or prevention of the sticking in the space portion and reduction of the drying time may simultaneously be achieved.

Preferably, the support 520 includes the dielectric layer 522, and the dielectric layer 522 includes at least one of the space portions 509A to 509D. As a result, an acoustic wave device capable of obtaining good resonance characteristics may be provided.

Preferably, the functional electrode includes one or more first electrode fingers extending in a second direction intersecting the first direction, and one or more second electrode fingers extending in the second direction and facing any of the one or more first electrode fingers in a third direction orthogonal or substantially orthogonal to the second direction. As a result, an acoustic wave device capable of obtaining good resonance characteristics may be provided.

Preferably, the thickness of the piezoelectric layer 2 is, for example, about 2p or less where p represents the center-to-center distance between the first electrode finger 3 and the second electrode finger 4 adjacent to each other out of the first electrode fingers 3 and the second electrode fingers 4. As a result, the acoustic wave device 1 may be reduced in size, and the Q factor may be higher.

Preferably, the piezoelectric layer 2 includes, for example, lithium niobate or lithium tantalate. As a result, an acoustic wave device capable of obtaining good resonance characteristics may be provided.

Preferably, Euler angles ($\varphi$, $\theta$, $\psi$) of lithium niobate or lithium tantalate forming the piezoelectric layer 2 are in a range of formula (1), formula (2), or formula (3) below. In the case above, the fractional bandwidth may sufficiently be widened.

$$(0°\pm10°, 0° \text{ to } 20°, \text{any } \psi) \quad \text{Formula (1)}$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(\theta-50)^2/900)^{1/2}] \text{ to } 180°) \quad \text{Formula (2)}$$

$$(0°\pm10°, [180°-30°(1-(\psi-90)^2/8100)^{1/2}] \text{ to } 180°, \text{any } \psi) \quad \text{Formula (3)}$$

Preferably, the acoustic wave device is configured to be capable of using a bulk wave in a thickness-shear mode. As a result, a coupling coefficient is increased, and it is possible to provide an acoustic wave device in which good resonance characteristics are obtained.

Preferably, for example, d/p is about 0.5 or less where d represents the thickness of the piezoelectric layer 2, and p represents the center-to-center distance between the first electrode finger 3 and second electrode finger 4 adjacent to each other. As a result, the acoustic wave device 1 may be reduced in size, and the Q factor may be higher.

More preferably, d/p is, for example, about 0.24 or less. As a result, the acoustic wave device 1 may be reduced in size, and the Q factor may be higher.

Preferably, MR≤about 1.75 (d/p)+0.075 is satisfied where MR represents a metallization ratio of the electrode fingers 3 and 4 to the excitation region C being a region where electrode fingers 3 and 4 adjacent to each other overlap each other in the facing direction. In the case above, the fractional bandwidth may reliably be set to about 17% or less.

Preferably, the acoustic wave device it is structured to use a plate wave. As a result, an acoustic wave device capable of obtaining good resonance characteristics may be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
   a support including a support substrate with a thickness in a first direction;
   a piezoelectric layer on the support in the first direction; and
   resonators each including a functional electrode on the piezoelectric layer in the first direction; wherein
   the support includes space portions at positions where the respective resonators at least partially overlap in plan view in the first direction;
   the space portions include a first space portion and a second space portion with an area larger than an area of the first space portion in plan view in the first direction;
   the piezoelectric layer includes a first through-hole communicating with the first space portion and a second through-hole communicating with the second space portion; and
   the first through-hole has an area larger than an area of the second through-hole in plan view in the first direction.

2. The acoustic wave device according to claim 1, wherein an area of a resonator of the resonators overlapping the second space portion in plan view in the first direction is larger than an area of a resonator of the resonators overlapping the first space portion.

3. The acoustic wave device according to claim 1, wherein an area of a resonator of the resonators overlapping the first space portion in plan view in the first direction is larger than an area of a resonator of the resonators overlapping the second space portion.

4. The acoustic wave device according to claim 1, wherein a resonator of the resonators overlapping the first space portion and a resonator of the resonators overlapping the second space portion in plan view in the first direction are either a series arm resonator or a parallel arm resonator.

5. The acoustic wave device according to claim 1, wherein a resonator of the resonators overlapping the first space portion and a resonator of the resonators overlapping the second space portion in plan view in the first direction are either a reception resonator or a transmission resonator.

6. The acoustic wave device according to claim 1, wherein
   the support includes an extended portion communicating with at least one of the space portions at a position not overlapping the at least one of the space portions in plan view in the first direction; and
   the piezoelectric layer includes a through-hole extending through the piezoelectric layer at a position overlapping the extended portion in plan view in the first direction.

7. The acoustic wave device according to claim 1, wherein
   the support includes a dielectric layer; and
   the dielectric layer includes at least one of the space portions.

8. The acoustic wave device according to claim 1, wherein the functional electrode includes one or more first electrode fingers extending in a second direction intersecting the first direction, and one or more second electrode fingers extending in the second direction and facing any of the one or more first electrode fingers in a third direction orthogonal or substantially orthogonal to the second direction.

9. The acoustic wave device according to claim 8, wherein a thickness of the piezoelectric layer is about 2p or less, where p represents a center-to-center distance between the first electrode finger and the second electrode finger adjacent to each other of the one or more first electrode fingers and the one or more second electrode fingers.

10. The acoustic wave device according to claim 9, wherein the center-to-center distance between the first electrode finger and the second electrode finger adjacent to each other is in a range of about 1 μm or more and about 10 μm or less.

11. The acoustic wave device according to claim 8, wherein the piezoelectric layer includes lithium niobate or lithium tantalate.

12. The acoustic wave device according to claim 11, wherein
Euler angles ($\varphi$, $\theta$, $\psi$) of the lithium niobate or the lithium tantalate are in a range of formula (1), formula (2), or formula (3):

$$(0°\pm10°, 0° \text{ to } 20°, \text{any } \psi) \quad \text{Formula (1);}$$

$$(0°\pm10°, 20° \text{ to } 80°, 0° \text{ to } 60°(1-(\theta-50)^2/900)^{1/2}) \text{ or}$$
$$(0°\pm10°, 20° \text{ to } 80°, [180°-60°(1-(\theta-50)^2/900)^{1/2}] \text{ to } 180°) \quad \text{Formula (2); and}$$

$$(0°\pm10°, [180°-30°(1-(\psi-90)^2/8100)^{1/2}] \text{ to } 180°, \text{any } \psi). \quad \text{Formula (3).}$$

13. The acoustic wave device according to claim 8, wherein the acoustic wave device is structured to generate a bulk wave in a thickness-shear mode.

14. The acoustic wave device according to claim 13, wherein d/p≤about 0.5 is satisfied, where d represents a thickness of the piezoelectric layer, and p represents a center-to-center distance between the first electrode finger and the second electrode finger adjacent to each other of the one or more first electrode fingers and the one or more second electrode fingers.

15. The acoustic wave device according to claim 14, wherein d/p is about 0.24 or less.

16. The acoustic wave device according to claim 8, wherein a width of each of the one or more first electrode fingers and the one or more second electrode fingers is in a range of about 150 nm or more and about 1000 nm or less.

17. The acoustic wave device according to claim 1, wherein the functional electrode includes an upper electrode and a lower electrode with the piezoelectric layer interposed therebetween in the first direction.

18. The acoustic wave device according to claim 1, wherein a thickness of the piezoelectric layer is about 50 nm or more and about 1000 nm or less.

19. The acoustic wave device according to claim 1, wherein
the functional electrode includes one or more first electrode fingers extending in a second direction intersecting the first direction and one or more second electrode fingers extending in the second direction and facing any of the one or more first electrode fingers in a third direction orthogonal or substantially orthogonal to the second direction; and
MR≤about 1.75 (d/p)+0.075 is satisfied, where MR represents a metallization ratio of the one or more first electrode fingers and the one or more second electrode fingers to an excitation region being a region where the first electrode finger and the second electrode finger adjacent to each other overlap each other when viewed in a direction in which the first electrode finger and the second electrode finger adjacent to each other face each other.

20. The acoustic wave device according to claim 1, wherein the acoustic wave device is structured to generate a plate wave.

* * * * *